United States Patent [19]

Lu et al.

[11] Patent Number: 5,897,290
[45] Date of Patent: Apr. 27, 1999

[54] LEAD FRAME MAGAZINE HANDLING DEVICE

[75] Inventors: Wen-Jung Lu, Paoshan; Chun-Kuei Lai, Hsinchu; Shyr-Shing Jaw, Chutung; Kae Lo, Taipei, all of Taiwan

[73] Assignee: Industrial Technology Research Institute, Hsinchu, Taiwan

[21] Appl. No.: 08/902,980

[22] Filed: Jul. 30, 1997

[51] Int. Cl.[6] .................................................. B65G 1/04
[52] U.S. Cl. .................... 414/790.4; 414/331; 414/417
[58] Field of Search .................... 414/225, 331, 414/403, 416, 417, 790.4, 603, 598, 594, 797.4

[56] References Cited

U.S. PATENT DOCUMENTS

| | | | |
|---|---|---|---|
| 4,221,522 | 9/1980 | Hoffman et al. | 414/417 |
| 5,097,983 | 3/1992 | Ushiki et al. | 221/21 |
| 5,516,251 | 5/1996 | Ichikawa | 414/331 |
| 5,727,917 | 3/1998 | Fuke et al. | 414/331 |

Primary Examiner—Karen M. Young
Assistant Examiner—Gregory A. Morse
Attorney, Agent, or Firm—W. Wayne Liauh

[57] ABSTRACT

A lead frame magazine handling device is disclosed which includes a magazine loading assembly, a magazine unloading assembly, two sets of receiving jaw mechanisms, a guided elevating assembly, and a programmable controller. The empty magazines are moved to the receiving jaw mechanism using the magazine loading assembly. At the same time, with the inner and outer sets of the receiving jaws in conjunction with the guided elevating assembly, one can alternately move the empty magazines and loads them to the lead frame receiving station to carry out the tasks of receiving and storing lead frames, and then, move to the magazine unloading assembly to unload the magazines which are fully loaded with lead frames so as to carry out the next operation.

7 Claims, 8 Drawing Sheets

LEAD FRAME MAGAZINE HANDLING DEVICE

FIELD OF INVENTION

The present invention is to provide a lead frame magazine handling device which, in a synchronous manner and by making use of two sets of parallelly arranged inner and outer receiving jaws, moves a plurality of lead frame magazines from a magazine loading mechanism to a lead frame receiving location so as to carry out the tasks of receiving and storing lead frames. Thereafter, the lead frame magazine handling device moves the lead frame magazines to a magazine unloading mechanism. In this manner, the operating efficiency can be improved.

BACKGROUND OF THE INVENTION

Figure 1:
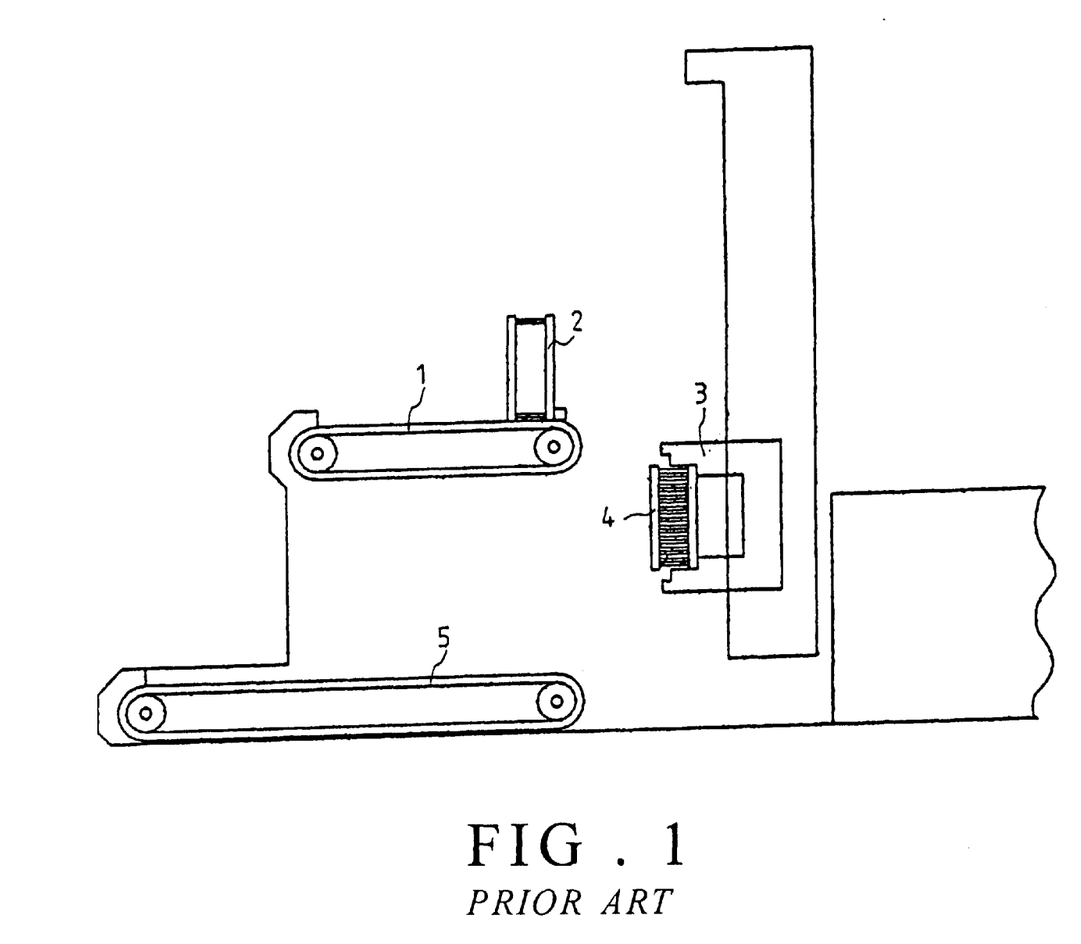
FIG. 1 is the schematic diagram of the conveying device of lead lead frame magazine of the prior art.

The electronic industry has changed very rapidly as the demand of IC continues to grow. In order to increase the production efficiency, IC manufacturers continue to improve their manufacturing process so as to reduce cost. While the manufacturing of lead frames of IC uses lead frame magazine to carry out the receiving and handling of lead frames, the issue of how to shorten the receiving and handling time of lead frame magazines has become a high priority problem for improving manufacturing efficiency. In general, a lead frame magazine handling device performs the loading and unloading operations in two stages, that is, upper and lower transmitting stages, respectively. It uses a mechanism that can move up and down to load the magazines in order to carry out the task of receiving the lead frames, which have passed through the die bonding process, and magazines, as shown in FIG. 1. This device needs to possess the task of automated magazine loading, automated magazine unloading, automated magazine changing and elevating indexing, in order to receive lead frames. While the design and control of the mechanism of the prior art is to use the input mechanism of empty magazine 1, i.e., a conveyor, to perform the input of an empty magazine 2, and to use a receiving jaw 3 to carry the magazine in order to perform indexing, lifting up and bringing down, and receiving the lead frame products. Furthermore, when the magazine is full, the fully-loaded magazine 4 will be sent to the magazine unloading mechanism 5. Finally, the magazine receiving jaw 3 will be sent back to the empty magazine input zone, thus completing a full cycle. The time period from the output location, for the receiving jaw 3, to the empty magazine supply location is the idle time of the system. Therefore, when the frequency of replacing magazines becomes very high, the operating mode of the mechanism still needs the three steps—the input of empty magazine, the lifting up and bringing down of the loaded or empty magazine, as well as the output of the fully-loaded magazine, to accomplish sequentially. Then, the time wasted on the waiting for supplementing magazines will have a significant effect to the system efficiency. The main reason is that it has only one set of magazine receiver and cannot do multiple tasking, thereby, the waiting time of magazine supplementation cannot be shortened, as a result, the system efficiency is low.

In order to resolve the handling efficiency of the lead frame magazine, the inventors, through years of working experience with continuous studies and designs, finally develop a lead frame magazine handling device that is relatively small in size, low in cost, high on efficiency, and that can positively execute lead frame supply, positioning, and receiving, in order to greatly raise working efficacy.

SUMMARY OF THE INVENTION

The primary objective of the present invention is to provide a lead frame handling device which comprises a magazine loading mechanism, a magazine unloading mechanism, two sets of receiving jaw mechanisms, a guided elevating mechanism, and a programmable controller. The magazine loading mechanism basically transports the magazines from the operating zone to the end of the input zone using a conveyer belt. An elevating check block is set up at the end of the input zone which can block the empty magazine in the input zone. A magazine pushing block is also set up at the end of the input zone which is controlled by a pneumatic cylinder to perform back-and-forth motions and push the magazine to the receiving jaw mechanism after the check block is descended. The inner and outer sets of receiving jaw mechanisms are set up in the input zone and are driven by independent stepping motors and screws respectively, and, in conjunction with the guided elevating mechanism, to send the magazines to the lead frame receiving location. Through the use of a programmable controller and in accordance with the output speed of the lead frames being finished manufacturing to lower step by step. It then receives the lead frames layer by layer until the magazines are full of the feeding material. By using the guided rollers of the guided elevating mechanism, the two receiving jaws move along the guided plate having a cam surface to carry out alternate ascending and descending motions in opposite directions to mutually accommodate and take turns to receive magazines. By means of the conveyer belt, the magazine unloading mechanism transports in the transverse direction of the operation. And by the use of a magazine push block to cause the magazine to be transported from the output zone toward the front side and to send out the fully-loaded magazine in order to completely place the lead frames in order inside the magazine and ready to be proceeded in the next stage of operation. In this way, by the use of the inner and outer receiving jaws to accommodate to the guided elevating mechanism, it can proceed in ascending and descending manners in opposite directions as well as changing of the magazine at the same time, while performing the loading and unloading tasks independently. As a result, by using the concurrent approach, it can shorten the waiting time of replenishing the magazine as well as raise the operating efficiency.

The next objective of the present invention is to provide a lead frame magazine handling device where the magazines are apt to drop due to their offset disposition on the conveyer belt when the size of the magazines changes since their center of gravity will also change accordingly. In order to prevent this phenomenon from happening, the transverse displacement of the magazine receiving jaw of the present invention is adjusted by a pneumatic cylinder while the longitudinal displacement is minutely adjusted by a screw manually, so as to accommodate the location of the center of gravity of the magazines in order to raise the adaptability of the receiving jaw.

Another objective of the present invention is to provide a lead frame magazine handling device where the number of magazine receiving jaws can be increased in accordance with their inner and outer arrangements as depending upon the practical requirement in order to increase the system efficiency.

In order to make your honor examiners better understand the present invention in more detail, the authors herewith present an embodiment with the accompanied drawings as shown in the followings:

BRIEF DESCRIPTION OF THE DRAWINGS

FIG. 7-A is the schematic motion diagram before the mutual passing of the ascending and descending of the two sets of receiving jaws of the present invention.

FIG. 7-B is the schematic diagram showing the completion of mutual passing of the ascending and descending of the two sets of receiving jaws of the present invention.

NUMBER INDEX FOR THE FIGURES

1: Conveying device
2: Empty magazine
3: Receiving jaw
4: Fully loaded magazine
5: Unloading mechanism
11A,11B: Conveying motor
12A,12B: Conveyer belt
13: Check block
14A,14B: Pneumaticcylinder
15:A,15B: Magazine push block
16A,16B: Pivot
21A,21B: Elevating frame
20A,20B: Receiving jaw
23A,23B: Connecting shaft
30A,30B: Guided roller
31A,31B: Connecting plate
311A,311B: L-shape bearing seat
40A,40B: Stepping motor
41A,41B: Screw
50: Guided plate
60,70: Magazine
80: Pneumatic cylinder
90: Screw

DETAILED DESCRIPTION OF THE INVENTION

Figure 2:
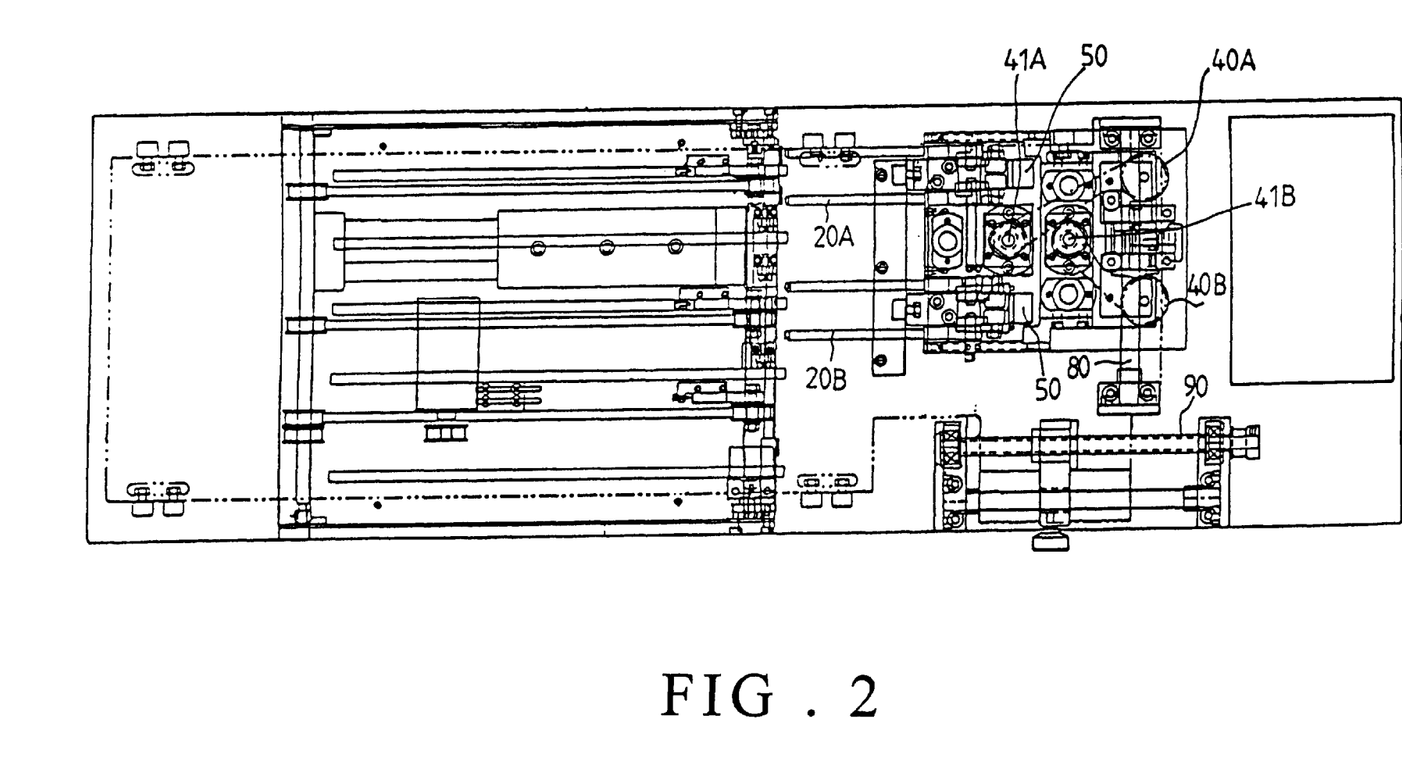
FIG. 2 is the top view of the present invention.
Figure 3:
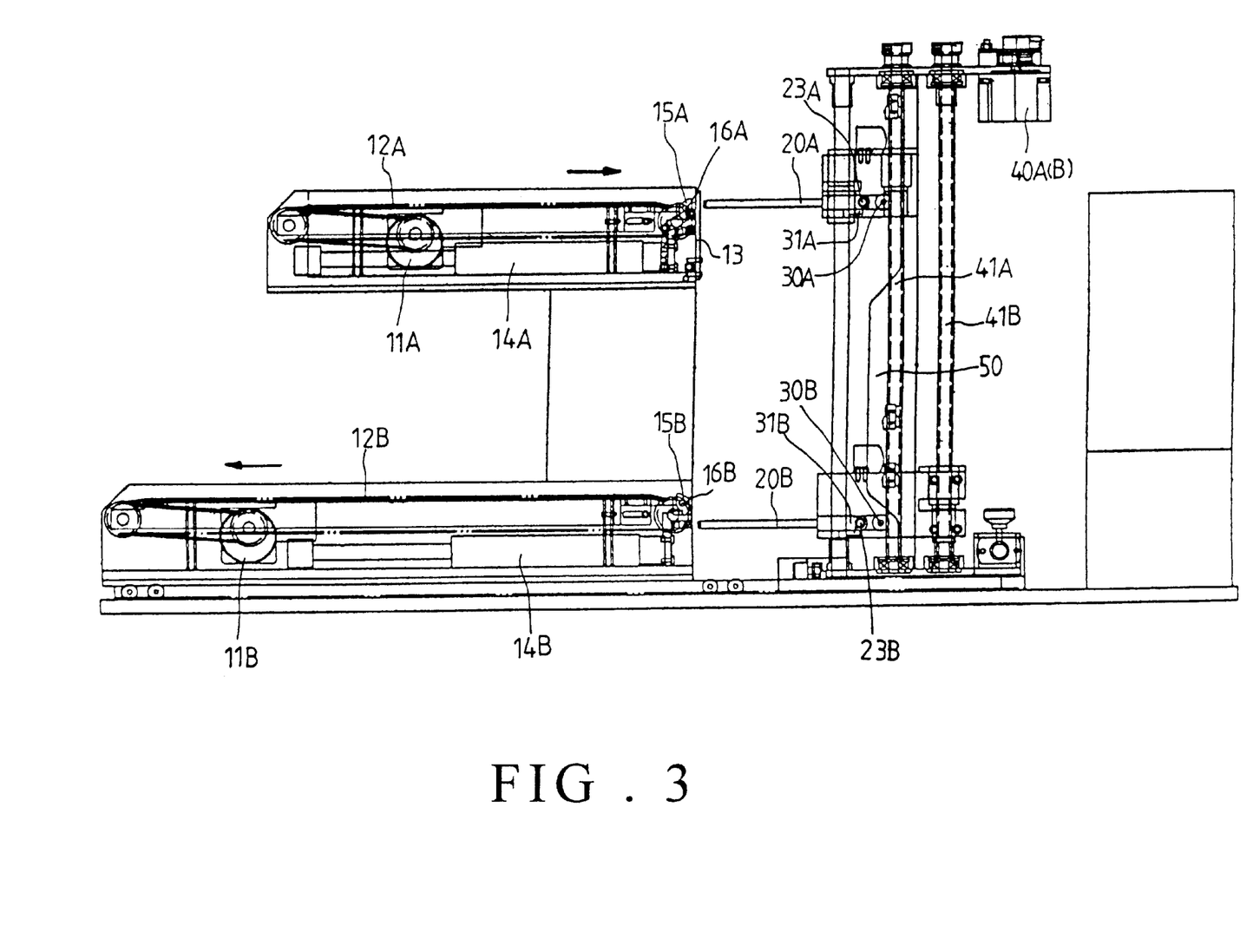
FIG. 3 is the side view of the present invention.
Figure 4:
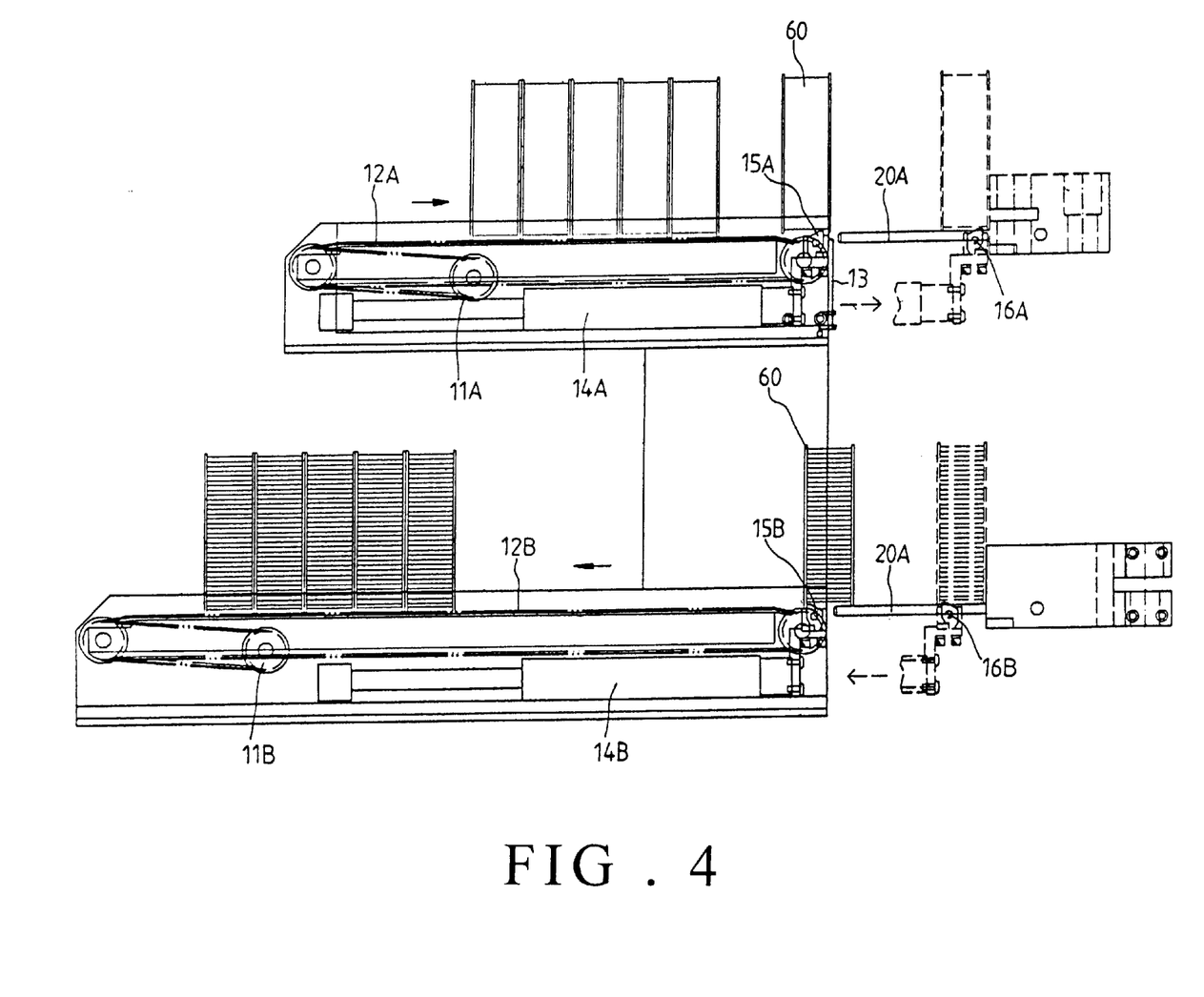
FIG. 4 is the schematic motion diagram of the magazine loading mechanism and unloading mechanism of the present invention.

As shown in FIGS. 2 and 3 and 4, the upper part of the present invention is an empty magazine loading mechanism, the lower part is a unloadng mechanism for fully loaded magazine. The right side is the programmable controller, the center part includes a receiving jaw mechanism and guided elevating mechanism. The magazine loading mechanism consists of a conveying motor 11A, conveyer belt 12A, check block 13, pneumatic cylinder 14A, and magazine push block 15A where the conveying motor 11A drives the conveyer belt 12A to transport toward the receiving jaw mechanism on the right hand side. The magazine push block 15A connected to the pneumatic cylinder 14A is set up at the terminal end of the conveyer belt 12A and is controlled by the pneumatic cylinder 14A to perform back-and-forth motions. Moreover, the magazine push block 15A, which can rotate with respect to the pivot 16A in one direction, is fitted to the pivot 16A by a torsion spring. Furthermore, the check block 13 set up at the terminal end of the loading mechanism of the machine frame controls the ascending and descending motions with a pneumatic cylinder. As for the fully loaded magazine blanking mechanism in the lower part, it consists of another similar set of components—a conveying motor 11B, a conveyer belt 12B, a pneumatic cylinder 14B, and a magazine push block 15B, where the conveyer belt 12B driven by the conveying motor 11B transports toward the transverse side of the operation, the magazine push block 15B set up at the terminal end of the conveyer belt 12B is controlled by the pneumatic cylinder 14B to perform back-and-forth motions, and the magazine push block 15B is also fitted to the pivot 16B by a torsion spring and it can also rotate with respect to the pivot in one direction.

Figure 5:
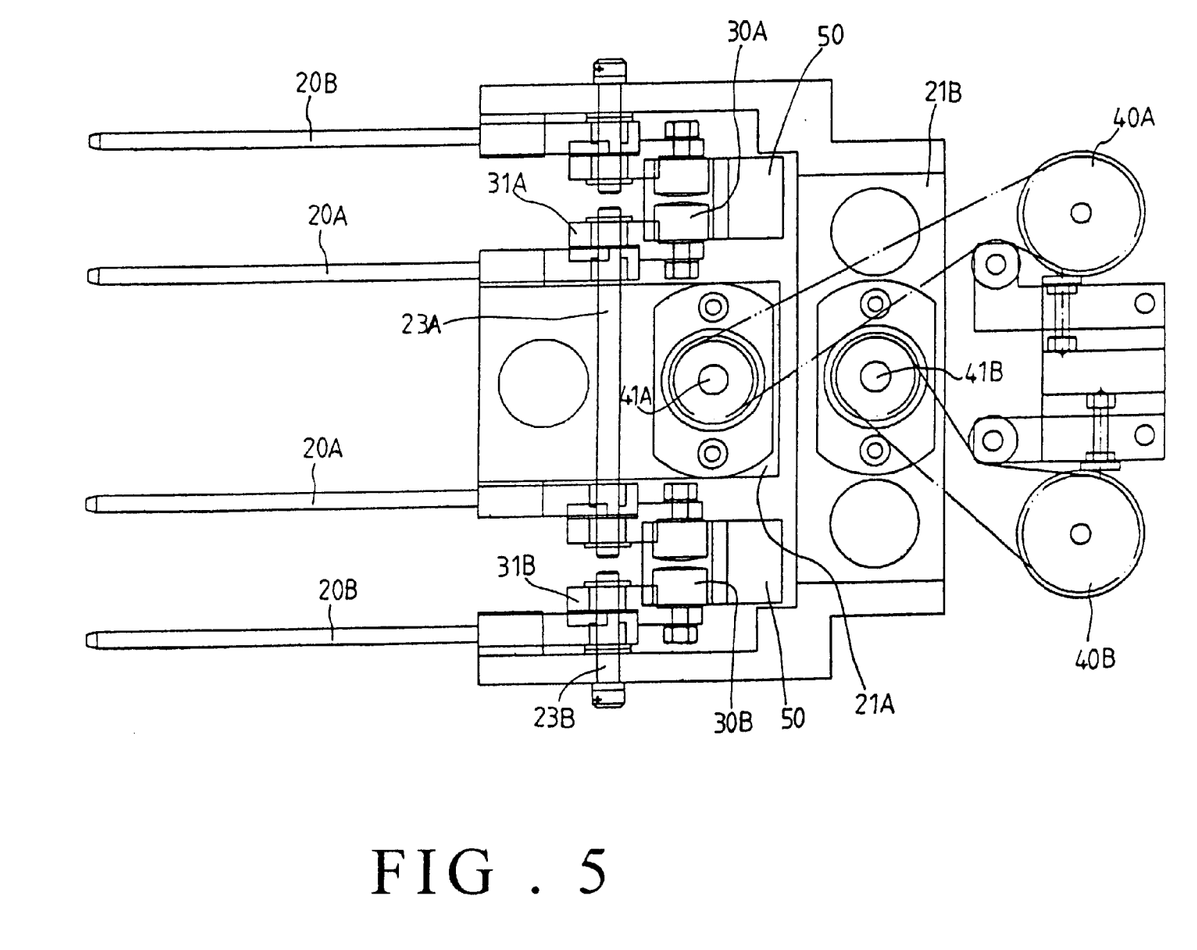
FIG. 5 is the top view of the inner and outer magazine receiving jaws of the present invention.
Figure 6:
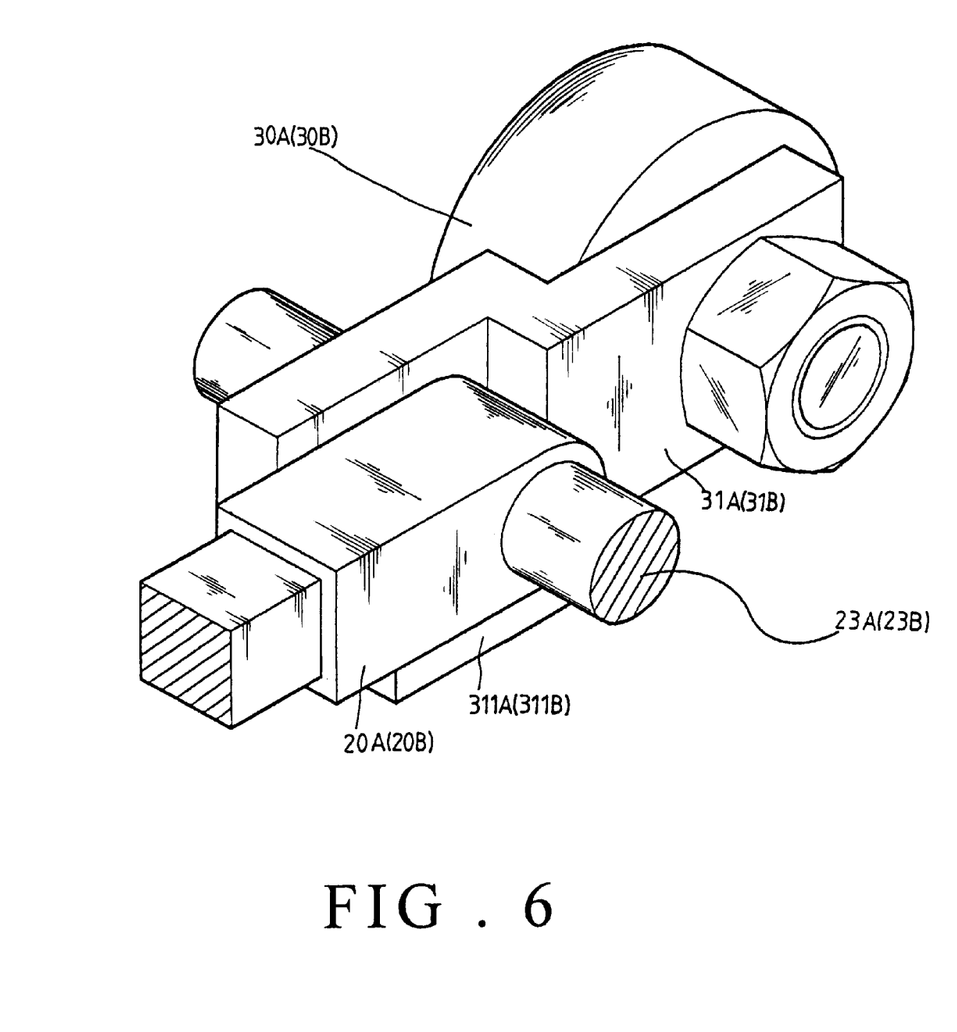
FIG. 6 is the schematic joint action diagram of the receiving jaws of the present invention.

As shown in FIGS. 3, 5, and 6, the receiving jaw mechanism in the center part mainly comprises inner and outer receiving jaws 20A,20B spaced apart with respect to each other, each comprising two parallel rods with their front end facing the conveyer belts 12A and 12B where the receiving jaws 20A and 20B are connected respectively to the elevating frames 21A and 21B which are mounted respectively on the screw 41A and 41B driven by the stepping motors 40A and 40B. The driven screws 41A and 41B, after turning, can drive the elevating frames 21A and 21B to carry out ascending and descending motions. In the meantime, the receiving jaws 20A and 20B will then drive the magazine up and down to move back to position. In addition, the guided elevating mechanism has a setup of connecting shafts 23A and 23B respectively at the rear end of the receiving jaws 20A and 20B, connecting plates 31A and 31B having L-shape loading seats 311A and 311B possesses a shaft hole and a torsion spring for connecting shaft 23A and 23B to penetrate through. And the loading seats 311A, 311B of the connecting plates 311A,311B are exactly propped up against the terminals of the receiving jaws 20A,20B while the rear end of the connecting plates 31A,31B are attached with guided rollers 30A,30B which can slide along the cam guided plate 50 set up on the frame. Thereby, when the elevating frames 21A, 21B drive the receiving jaws 20A, 20B to ascend and descend, the guided rollers 30A, 30B will slide along the guided plate 50, and, by means of the design of the cam surface and the actions of the connecting plates 31A, 31B to enable the receiving jaws 20A, 20B to carry out the actions of horizontal descending and vertical ascending.

Furthermore, as shown in FIGS. 3,4, when the operation begins, by the use of the conveying motor 11A, the empty magazine 60 is transported toward the receiving jaw 20A by the conveyer belt 12A until it gets to the end of the conveyer belt 12A to touch the inclined plane of the "Magazine push block" 15A to push it down to rotate. The empty magazine 60 is then stopped by the check block 13 after passing the "magazine push block" 15A while the "magazine push block" 15A will be turned back into position under the empty magazine 60 by means of the torsion spring. At this moment, the receiving jaw 20A is waiting for being loaded behind the rear end of the conveyer belt 12A, the check block 13 descends to release the empty magazines 60 which are then pushed forward to the receiving jaw 20A by the magazine push block 15A by means of the transmission of the pneumatic cylinder 14A and are sucked to be positioned on the receiving jaw 20A by means of vacuum, and the "magazine push block" 15A is then pulled back to the original position again by the pneumatic cylinder 14A. The "magazine push block" 15A can be separated from the empty magazine 60 with its inclined plane touches the empty magazine 60, then is pressed down to rotate, thereafter, turned back to the original position by the torsion spring, in the meantime, the check block 13 ascends and comes back to its original position to stop the empty magazines which are lined up behind to complete one time of conveying operation of the empty magazine 60.

Figure 7:
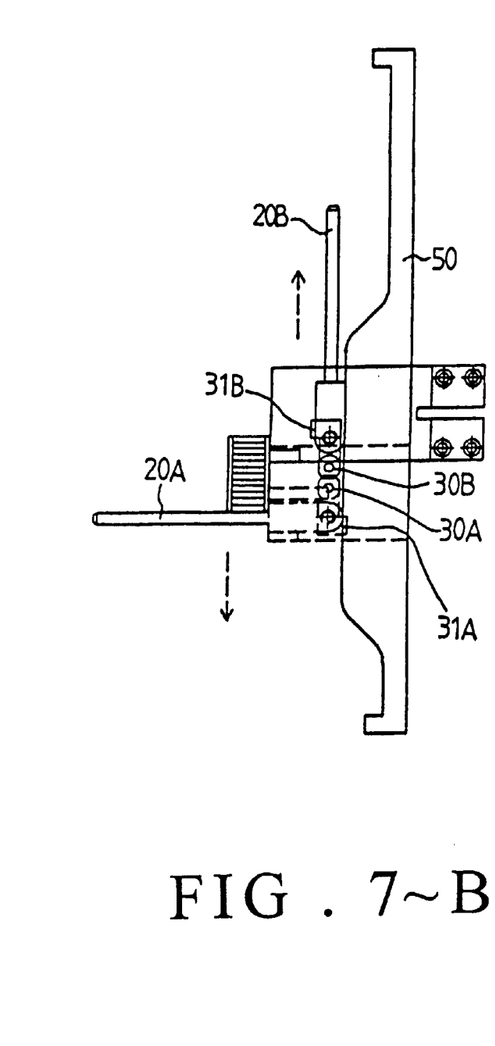
Figure 8A:
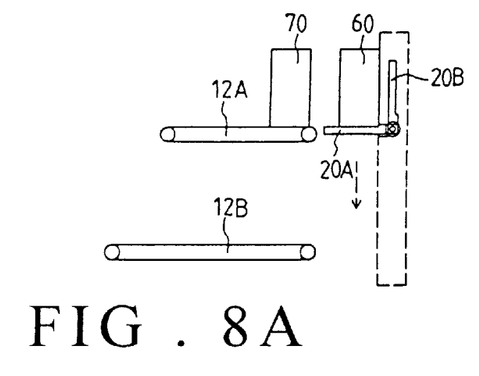
FIG. 8 is the motion time-history of the two sets of receiving jaws of the present invention.
Figure 8B:
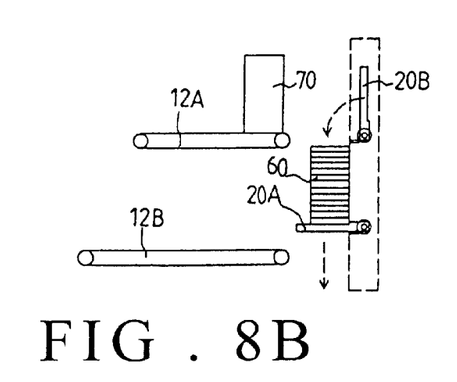
Figure 8C:
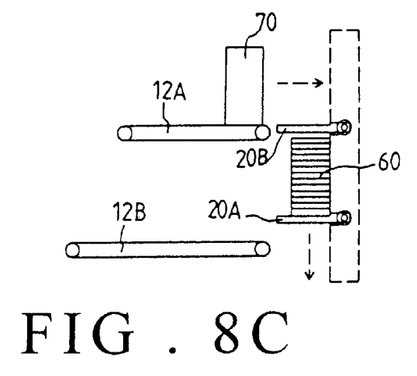
Figure 8D:
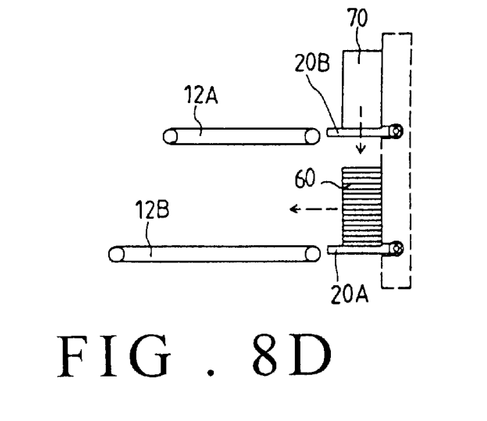
Figure 8E:
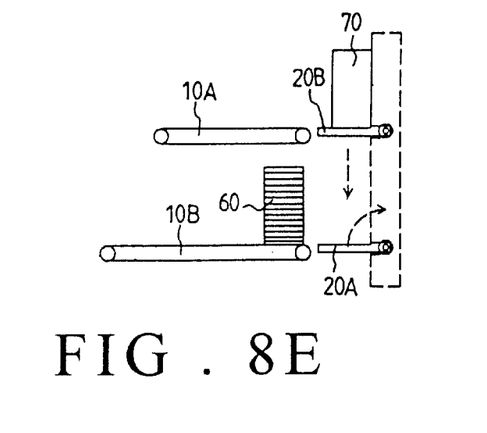
Figure 8F:
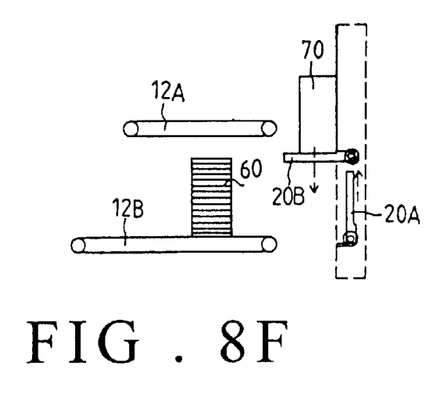

As shown in FIGS. 3, 5, 6, and 7-A, when the empty magazine 60 is sent to the receiving jaw 20A by the magazine push block 15A, the receiving jaw 20A will remain at the upper horizontal position, while the receiving jaw 20B will remain at the lower horizontal position. When the stepping motors 40A, 40B begin to activate, the upper receiving jaw 20A will be driven by 21A to descend and move the empty magazine 60 to the receiving position while the lower receiving jaw 20B will be driven by 21B to ascend. While it keeps on activating, the upper guided roller 30A begins to touch the cam surface of the guided plate 50 and cause the connecting plate 31A to carry out a counterclockwise rotation along the connecting shaft 23A at the rear end of receiving jaw 20A. At this moment, the L-shape loading seat 311A will separate from the poped up condition to the receiving jaw 20A and remain in horizontal position while the guided roller 30B of the lower receiving jaw 20B touches the cam surface of the guide plate 50 and the guided roller 30B, together with the connecting plate 31B, performs a clockwise rotation, at this time, the L-shape loading seat 311B of the connecting plate can exactly prop up against the receiving jaw 20B and drive the empty receiving jaw 20B having finished magazine unloading to rotate and ascend to be in vertical position. As it continue to activate, the receiving jaw 20A will drive the magazine 60 to descend gradually to receive sequentially lead frames layer by layer, while the guided roller 30A will move along the cam surface of the guided plate 50 and let the connecting plate 31A show a vertical condition but the receiving jaw 20A remains in horizontal condition. As shown in FIG. 7-B, the receiving jaw 20A keeps on descending until when it makes the guided roller 30A separated from the cam surface, the connecting plate 31A will cause it to rotate back to its original horizontal position and at this moment, the magazine also complete the full loaded condition and the receiving jaw 20A gets to the unloading position. In addition, at the same time the receiving jaw 20A is descending, the receiving jaw 20B can pass with the receiving jaw 20A, which is loaded with magazine, without interfering with the magazines in the receiving jaw 20A, since it is in vertical position. That is, as the receiving jaw 20A is descending, the receiving jaw 20B will carry out ascending and rotating actions and, before they pass each other, the receiving jaw 20A remains horizontally loading the magazines while the receiving jaw 20B is passing in vertical position in order to complete the position interchange of the two receiving jaw 20A and 20B.

Referring again to FIGS. 3 and 4, when the receiving jaw 20A moves the magazines, which are full of lead frames, to the unloading position, the "magazine push block" 15B of the conveyer belt 12B moves forward by the pneumatic cylinder 14B such that it locks into the lower part of the fully loaded magazine 60 following its inclined surface and its rotating action and then rotates back to the original position by means of the torsion spring. At this moment, the receiving jaw 20A releases the vacuum suction force acting to the full-loaded magazine 60 which is then sent to the conveyer belt 12B as the pneumatic cylinder 14B pulls back the "magazine pushing block 15B, thereafter, the conveyer belt 12B driven by the conveying motor 11B to transport the full-loaded magazine 60 toward the operator side to complete one time of conveying operation of the empty magazine 60.

As shown in FIG. 8, the planning of the activation procedures of the receiving jaw 20A, 20B are as follows:

8-A. Initial state: the receiving jaw 20A is at the horizontal position on the upper conveyer belt 12A, while the receiving jaw 20B is at vertical position on the top, the empty magazine 60 are sent from the conveyer belt 12A into the receiving jaw 20A.

8-B. The receiving jaw 20A descends, while the receiving jaw 20B rotates to the horizontal position.

8-C. The other empty magazines 70 are sent forward from the conveyer belt 12A to the receiving jaw 20B, while the receiving jaw 20A continues to descend in order that the magazines 60 can receive lead frames.

8-D. The receiving jaw 20A descends to stop at the location of the conveyer belt 12B and the fully-feeded magazines 60 are ready to be sent to the conveyer belt 12B, while the receiving jaw 20B has already loaded the other empty magazine 70 and is going to descend.

8-E. The receiving jaw 20A is going to ascend to the rotating position after the full-loaded magazines 60 are sent out, while the receiving jaw 20B descends.

8-F. The receiving jaw 20A ascends to become at vertical position, while the receiving jaw 20B descends to the location of the conveyer belt 12B.

The receiving jaws 20A, 20B can carry out the action of "go around and begin again" and perform systematic magazine conveying.

As shown again in FIGS. 2 and 3, when the size of the magazines changes, the center of gravity of the magazines placed on the receiving jaw 20A, 20B also changes. In the light of the change of the center of gravity, the transverse displacement of the magazine receiving jaw of the present invention is adjusted by the pneumatic cylinder 80 while the longitudinal displacement is adjusted manually by the screw 90 to perform minute adjustment to accommodate to the location of the center of gravity of the magazines. They also can be controlled by the programmable controller depending on their requirements. Therefore, the design of the magazine receiving jaw of the present invention possesses very high adaptability since in the future, the lead frame magazines, in the light of their different sizes, can all be adjusted.

To summarize the above-mentioned statements, the present invention has the following advantages:

1. To accommodate the guided mechanism, the design of the two sets of magazine receiving jaws can ascend and descend as well as changes simultaneously which can attain the many benefits.

2. The shortening of the waiting time of replenishing the magazines can improve the system efficiency.

3. Because of the compact volume of the present invention, in the future, it can be enlarged on its arrangement or made the best use of the space, for instance, to enlarge the buffer zones of the input and output of the magazines in order to cut down the arrangements of the human resource; or to increase the number of magazine receiving jaw to increase the system efficiency.

4. The location of the magazine receiving jaw can be adjusted which provide a lot more flexibility in the light of the different size of magazines.

To summarize the above-mentioned statements, the present invention simplifies the operating procedures, attains the objectives of being convenient to install, easy to control, and of reducing the cost of manufacturing. Therefore, it is really practical and progressive with commercial value that can be provided for the industrial application. Furthermore, the present invention is not found in any publications, therefore, it meets the requirements of patentability and is in accordance with the Patents Act.

Although the present invention has been illustrated and described previously with reference to the preferred embodiments thereof, it should be appreciated that it is in no way limited to the details of such embodiments, but is capable of numerous modification within the scope of the appended claims.

What is claimed is:

1. A lead frame magazine handling device comprising:

(a) a magazine loading mechanism, which comprises a conveying motor, a conveyer belt, a check block, a pneumatic cylinder, and a magazine push block; wherein said conveyer belt is driven by said conveying motor, said magazine push block, which is disposed at a terminal end of said conveyer belt, is controlled by said pneumatic cylinder to perform a back-and-forth motion to transport an empty magazine, and said check block, which is disposed beyond said push block, can ascend and descend to stop said empty magazine;

(b) a magazine unloading mechanism, which comprises a conveying motor, a conveyer belt, a pneumatic, and a magazine push block; wherein said conveyer belt is driven by said conveying motor, said magazine push block, which disposed at said terminal end of said conveyer belt, is controlled by said pneumatic cylinder to perform a back-and-forth motion to unload a loaded magazine;

(c) first and second receiving jaw mechanisms, wherein each said receiving jaw mechanism comprises a receiving jaw, a stepping motor, a transmission screw, and a transmission rod frame; each said receiving jaw includes two rod-shaped members which are arranged side by side and are connected to said transmission rod frame, which is meshed with said transmission screw and is driven by a stepping motor;

(d) first and second guided elevating mechanisms for ascending and descending said first and second receiving jaw mechanisms, respectively, wherein each said guided elevating mechanism comprises a connecting plate, a guided roller, and a guided plate;

(e) first and second connecting shafts for respectively connecting said first and second receiving jaws to said first and second guided elevating mechanisms and causing said first and second receiving jaws to pivot, wherein each of said connecting shaft is disposed at a terminal end of a respective receiving jaw, further wherein said connecting plate is slipped on said connecting shaft, said connecting plate has an L-shaped loading seat, which can prop up against said terminal end of said receiving jaw so as to, in conjunction with a cam surface on said guided plate, cause said receiving jaw to pivot, and a rear end of said connecting plate contains a guided roller to move along said guided plate;

(f) whereby said first and second receiving jaws are activated simultaneously at a respective end of said conveyer belt, so as to load empty magazines and unload loaded magazines simultaneously.

2. A lead frame magazine as claimed in claim 1 wherein a torsion spring is disposed at said magazine push block of the magazine loading mechanism which causes it to perform a one-way rotation and to resume a previous position in order to automatically send empty magazines to a receiving jaw and then to rotate so as to separate from the magazines and resume its position.

3. A lead frame magazine as claimed in claim 1 wherein said check block of said magazine loading mechanism is driven by said pneumatic cylinder to ascend and descent.

4. A lead frame magazine as claimed in claim 1 wherein a torsion spring is disposed at said magazine push block of said magazine unloading mechanism which causes it to perform a one-way rotation and resume its previous position in order to automatically send fully-loaded magazines to said conveyer belt of said magazine unloading mechanism to unload and then to rotate and separate from the magazines and resume its position.

5. A lead frame magazine as claimed in claim 1 wherein a torsion spring is disposed at the connecting plate of said guided elevating mechanism to slip on to said connecting shaft of a respective said receiving jaw such that said respective receiving jaw can automatically rotate to resume its horizontal position while said guided rollers separate from said cam surface of said guided plate.

6. A lead frame magazine as claimed in claim 1 wherein said first receiving jaw is located at the upper part of said guided plate said second receiving jaw is located under said guided plate so that when said first and second receiving jaws are ascending and descending in opposite directions, said guide elevating mechanism allow said first and second receiving jaws to be in alternating horizontal and vertical positions.

7. A lead frame magazine as claimed in claim 1 wherein the first and second receiving jaws can carry out position adjustment in both longitudinal and transverse directions to accommodate the center of gravity of magazines in different sizes using a pneumatic pressure or a screw.

* * * * *